(12) United States Patent
Kleveland (10) Patent No.: US 7,564,707 B2
(45) Date of Patent: Jul. 21, 2009

(54) ONE-TIME PROGRAMMABLE NON-VOLATILE MEMORY

(75) Inventor: Bendik Kleveland, Santa Clara, CA (US)

(73) Assignee: ZeroG Wireless, Inc., Sunnyvale, CA (US)

( * ) Notice: Subject to any disclaimer, the term of this patent is extended or adjusted under 35 U.S.C. 154(b) by 146 days.

(21) Appl. No.: 11/843,404

(22) Filed: Aug. 22, 2007

(65) Prior Publication Data

US 2009/0052220 A1    Feb. 26, 2009

(51) Int. Cl.
*G11C 17/00*    (2006.01)
(52) U.S. Cl. ...................... 365/96; 365/225.7
(58) Field of Classification Search .............. 365/96, 365/105, 225.7; 438/131, 467
See application file for complete search history.

(56) References Cited

U.S. PATENT DOCUMENTS

| | | | |
|---|---|---|---|
| 4,661,927 A | 4/1987 | Graebel | |
| 5,742,555 A | 4/1998 | Marr et al. | |
| 5,768,192 A | 6/1998 | Eitan | |
| 6,040,608 A | 3/2000 | Ma et al. | |
| 6,218,695 B1 | 4/2001 | Nachumovsky | |
| 6,441,422 B1 | 8/2002 | Mandelman et al. | |
| 6,466,498 B2 | 10/2002 | Hogan | |
| 6,597,598 B1 | 7/2003 | Tran et al. | |
| 6,617,914 B1 | 9/2003 | Kothandaraman | |
| 6,713,839 B2 * | 3/2004 | Madurawe | 257/530 |
| 6,803,804 B2 * | 10/2004 | Madurawe | 327/525 |
| 7,046,569 B2 | 5/2006 | Ito et al. | |
| 2003/0141532 A1 | 7/2003 | Kato | |
| 2004/0169218 A1 | 9/2004 | Randolph et al. | |
| 2004/0223352 A1 | 11/2004 | Snider | |
| 2007/0026606 A1 | 2/2007 | Chou et al. | |
| 2007/0076463 A1 | 4/2007 | Keshavarzi et al. | |
| 2007/0165441 A1 | 7/2007 | Kurjanowicz et al. | |

OTHER PUBLICATIONS

H. Ito et al., "Pure CMOS One-Time Programmable Memory using Gate-ox Anti-fuse," IEEE 2004 Custom Integrated Circuits Conf., pp. 469-472 (2004).

* cited by examiner

*Primary Examiner*—Gene N. Auduong
(74) *Attorney, Agent, or Firm*—Edouard Garcia (57) ABSTRACT

An apparatus includes a semiconductor substrate, elongated diffused well regions, and elongated conductors. The semiconductor substrate has a first electrical conductivity type. The elongated diffused well regions are in the semiconductor substrate. The diffused well regions have a second electrical conductivity type opposite the first electrical conductivity type. Each of the elongated electrical conductors crosses the diffused well regions at respective locations of one-time programmable memory cells. Each of the memory cells includes a antifuse structure between the respective diffused well region and the respective electrical conductor. Each of the memory cells has a first state in which the antifuse structure has a first electrical resistance and a second state in which the antifuse structure has a second electrical resistance lower than the first electrical resistance. In the second state, each of the memory cells includes a rectifying junction between the respective diffused well region and the respective electrical conductor.

13 Claims, 8 Drawing Sheets

ONE-TIME PROGRAMMABLE NON-VOLATILE MEMORY

BACKGROUND

One-time programmable non-volatile memories provide persistent storage of a wide variety of different types of useful information, including information for remapping defective dynamic random access memory addresses, parameter values for calibrating analog circuits or changing circuit configurations, identifiers (e.g., semiconductor chip serial numbers and hardware addresses) and codes (e.g., encryption keys), and management information (e.g., fabrication process log data).

A one-time programmable non-volatile memory is a memory that has memory elements that are electrically programmed by irreversibly changing their states. The information that is stored in a one-time programmable non-volatile memory persists even when the memory is disconnected from its power source. A one-time programmable non-volatile memory has a plurality of cells that can be programmed irreversibly from an initial state that is characterized by an initial electrical characteristic to a programmed state that is characterized by a programmed electrical characteristic that is measurably different from the initial electrical characteristic.

One common type of one-time programmable memory includes fusible links that have an unprogrammed state that is characterized by a low electrical resistance and a programmed state that is characterized by a high electrical resistance. Such fusible links typically are programmed selectively either by laser trimming or by application of a sufficiently high electrical current that creates open circuits in the links. Another common type of one-time programmable memory includes antifuses that have an unprogrammed state that is characterized by a high electrical resistance and a programmed state that is characterized by a low electrical resistance. Such antifuses typically are programmed selectively by applying a sufficiently high electrical voltage that breaks down dielectric elements in the antifuses.

SUMMARY

In one aspect, the invention features an apparatus that includes a semiconductor substrate, elongated diffused well regions, and elongated conductors. The semiconductor substrate is of a first electrical conductivity type. The elongated diffused well regions are in the semiconductor substrate. The diffused well regions are of a second electrical conductivity type opposite the first electrical conductivity type. Each of the elongated electrical conductors crosses the diffused well regions at respective locations of one-time programmable memory cells. Each of the memory cells includes a respective antifuse structure between the respective diffused well region and the respective electrical conductor. Each of the memory cells has a first state in which the antifuse structure has a first electrical resistance and a second state in which the antifuse structure has a second electrical resistance lower than the first electrical resistance. In the second state each of the memory cells includes a respective rectifying junction between the respective diffused well region and the respective electrical conductor.

In one aspect, the invention features a method. In accordance with this inventive method, elongated diffused well regions of a second electrical conductivity type are produced in a semiconductor substrate of a first electrical conductivity type opposite the second electrical conductivity type. Dielectric material is formed over the diffused well regions. Electrically conducting material is deposited over the dielectric material. The electrically conducting material and the dielectric material are patterned to respectively form elongated electrical conductors and underlying antifuse structures. Each of the electrical conductors crosses the diffused well regions at respective one-time programmable memory cells. Each of the memory cells includes a respective one of the antifuse structures between the respective diffused well region and the respective electrical conductor. Each of the memory cells has a first state characterized by a first electrical resistance and a second state characterized by a second electrical resistance lower than the first electrical resistance. In the second state each of the memory cells includes a respective rectifying junction between the respective diffused well region and the respective electrical conductor.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

I. Introduction

The embodiments that are described herein enable the production of one-time programmable non-volatile memory circuits that are characterized by high memory cell densities and fast read/write speeds. In addition, these embodiments can be implemented using conventional CMOS technology. This feature allows these implementations to be integrated readily into existing CMOS process flows, reducing fabrication costs and shortening lead times.

II. A First Embodiment of a One-Time Programmable Memory Circuit

Figure 1:
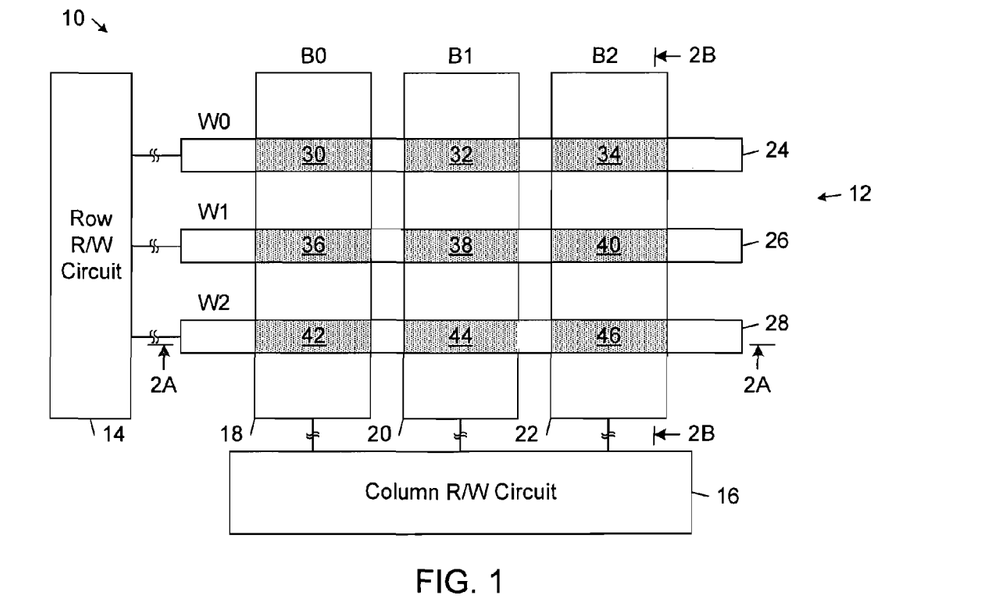
FIG. 1 is a diagrammatic view of an embodiment of a one-time programmable non-volatile memory circuit that includes a memory cell array, a row read/write circuit, and a column read/write circuit.

FIG. 1 shows an embodiment of a one-time programmable non-volatile memory circuit 10 that includes a memory cell array 12, a row read/write circuit 14, and a column read/write circuit 16.

Figure 2A:
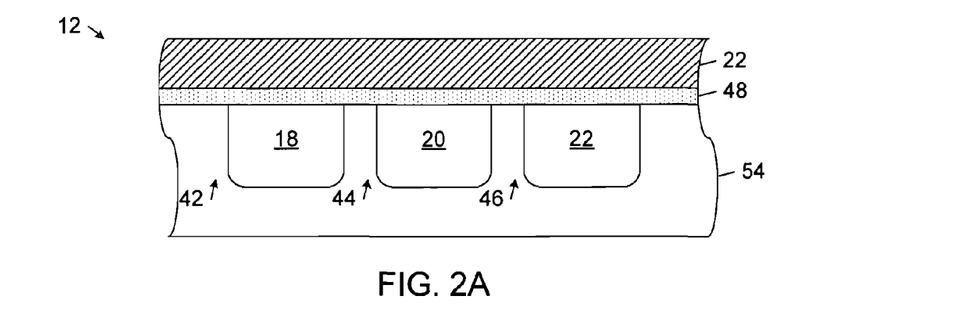
FIG. 2A is a diagrammatic sectional view of the memory cell array shown in FIG. 1 taken along the line 2A-2A.
Figure 2B:
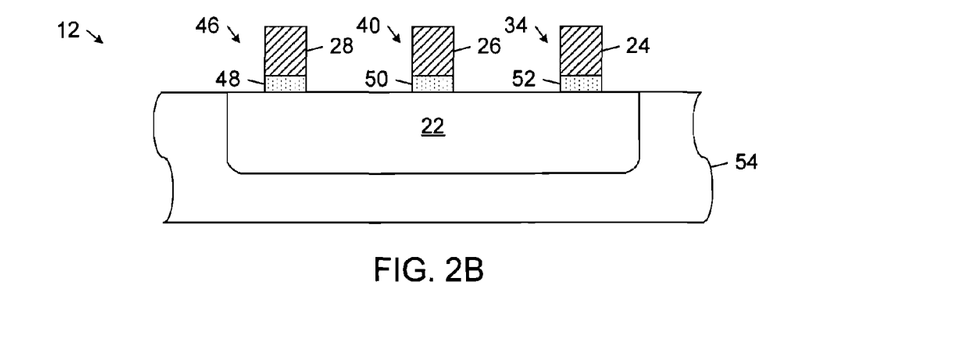
FIG. 2B is a diagrammatic sectional view of the memory cell array shown in FIG. 1 taken along the line 2B-2B.

The memory cell array 12 includes a set of elongated diffused well regions 18, 20, 22 and a set of elongated electrical conductors 24, 26, 28. Each of the electrical conductors 24-28 crosses the diffused well regions 18-22 at locations of respective memory cells 30, 32, 34, 36, 38, 40, 42, 44, 46. As shown in FIGS. 2A and 2B, each of the memory cells 30-46 includes a respective antifuse structure 48, 50, 52 between the respective electrical conductor 24-28 and the respective diffused well region 18-22. Each memory cell 30-46 is a respective one-time programmable memory cell that has a first state and a second state. In the first state, each memory cell has a first electrical resistance. In the second state, each memory cell has a second electrical resistance lower than the first electrical resistance. The memory cells 30-46 are formed in a semiconductor substrate 54, which has an electrical conductivity type that is opposite the electrical conductivity type of the diffused well regions 18-22.

In the illustrated embodiment, the diffused well regions 18-22 form respective bit lines (respectively labeled B0, B1, B2) that are connected electrically to the column read/write circuit 16 and the electrical conductors 24-28 form respective word lines (respectively labeled W0, W1, W2) that are connected electrically to the row read/write circuit 14. The row read/write circuit 14 and the column read/write circuit 16 cooperatively apply write and read signals across selected ones of the memory cells 30-46 in order to irreversibly program respective ones of the memory cells and to sense the respective states of the memory cells. In one exemplary embodiment, the row read/write circuit 14 includes a respective drive circuit for each of the electrical conductors 24-28 and the column read/write circuit 16 includes a respective state sense circuit for each of the diffused well regions 18-22. In another exemplary embodiment, the column read/write circuit 16 includes a respective drive circuit for each of the electrical conductors 24-28 and the row read/write circuit 14 includes a respective state sense circuit for each of the diffused well regions 18-22.

In the first (unprogrammed) state, each of the memory cells includes a capacitor between the respective diffused well region and the respective electrical conductor. In the second (programmed) state, each of the memory cells includes a rectifying junction between the respective diffused well region and the respective electrical conductor. For example, in the embodiments described in detail below, each of the memory cells presents a respective capacitive structure in the electrical current flow path between the respective diffused well region and the respective electrical conductor when the memory cell is in the first state; and each of the memory cells presents a respective diode structure in the electrical current flow path between the respective diffused well region and the respective electrical conductor when the memory cell is in the second state. Thus, in the first state each memory cell operates as a capacitor and therefore does not conduct direct current, whereas in the second state each memory cell operates as a rectifier and therefore only conducts direct current in one direction. This feature of the memory cells enables the memory cells to be arranged in high density two-dimensional arrays.

Figure 3:
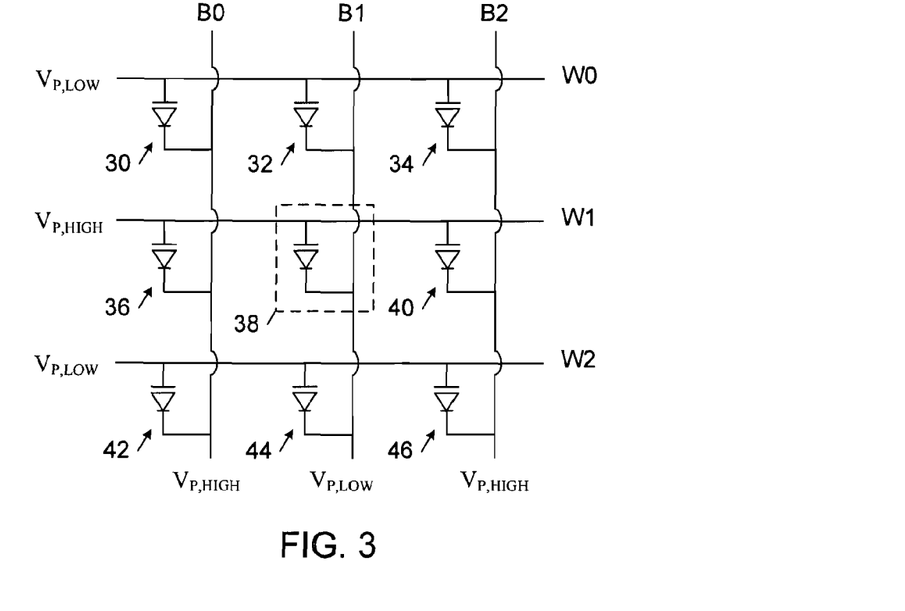
FIG. 3 is a circuit diagram of an embodiment of the memory cell array in the one-time programmable non-volatile memory circuit of FIG. 1.

FIG. 3 shows a schematic diagram of the memory cell array 12 (FIG. 1) in an unprogrammed state, where each of the memory cells 30-46 is represented by a respective circuit symbol that is formed from a serial combination of a capacitor a diode. The memory cell array 12 (FIG. 1) is programmed (or written to) by selectively applying a write voltage across selected ones of the memory cells 30-46, where the write voltage is applied with a magnitude and a duration that is sufficient to blow the antifuse structure in the memory cells 30-46. For example, in embodiments in which the antifuse structures are dielectric barriers, the write voltage is applied with a magnitude and duration that is sufficient to irreversibly create one or more conductive filaments across the dielectric barrier. The memory cell array 12 (FIG. 1) is read by selectively applying a read voltage across selected ones of the memory cells 30-46 and sense the resulting read current. The read voltage is less than the write voltage and typically is selected to produce a specified forward bias flow of current through the selected memory cell. The read current may be sensed in a wide variety of different ways. In some embodiments, the read current is sensed by converting the current to a voltage and comparing the voltage to a reference voltage using a comparator circuit.

FIG. 3 also shows an exemplary biasing scenario for selectively programming the memory cell 38. In this scenario, a high programming voltage ($V_{P,HIGH}$) is applied to the electrical conductor W1 and a low programming voltage ($V_{P,LOW}$) is applied to the diffused well region B1, where the difference between the high and low programming voltages is equal to the write voltage (i.e., $V_{P,HIGH}-V_{P,LOW}=V_{WRITE}$). At the same time, the low programming voltage is applied to the electrical conductors W0, W2 (i.e., $V_{W0}=V_{W2}=V_{P,LOW}$) and the high programming voltage is applied to the diffused well regions B0, B2 (i.e., $V_{B0}=V_{B2}=V_{P,HIGH}$). In this example, the voltage across the antifuse structure of the memory cell 38 is the write voltage minus the voltage drop across the rectifying junction, which is forward biased. The memory cells 32, 36, 40, and 44 will not be programmed under the programming scenario shown in FIG. 3 because the voltage drops across the memory cells 32, 36, 40, and 44 are close to zero (depending on the accuracy with which the voltages can be applied to the word lines W0, W1, W2 and the bit lines B0, B1, B2). The memory cells 30, 34, 42, and 46 also will not be programmed under the programming scenario shown in FIG. 3 because the rectifying junctions in these memory cells will be reverse biased and the resulting large voltage drop across the rectifying junctions will reduce the voltage applied across the antifuse structures below the level needed to blow the antifuse structures. Thus, the presence of the rectifying junctions in the memory cells 30, 34, 42, and 46 prevents these memory cells from inadvertently being programmed.

The memory cell array 12 may be read in an analogous way, except that the high and low programming voltages ($V_{P,HIGH}$, $V_{P,LOW}$) are replaced by high and low sense voltages ($V_{S,HIGH}$, $V_{S,LOW}$), where the difference between the high and low sense voltages is equal to the read voltage (i.e., $V_{S,HIGH} - V_{S,LOW} = V_{READ}$). During reading, the presence of the rectifying junctions in the memory cells enables each of the memory cells in the memory cell array 12 to be read individually. For example, the memory cell 38 may be read by biasing the word lines W0, W1, W2 and the bit lines B0, B1, B2 as shown in FIG. 3, with the high and low programming voltages ($V_{P,HIGH}$, $V_{P,LOW}$) replaced by the high and low sense voltages ($V_{S,HIGH}$, $V_{S,LOW}$). In this example, the read voltage is applied across the memory cell 38. If the memory cell 38 is in the first (unprogrammed) state, the antifuse structure will be intact and no current will be sensed. If the memory cell 38 is in the second (programmed) state, the antifuse structure will be blown and the read voltage will forward bias the rectifying junction, which will conduct a measurable current. The memory cells 32, 36, 40, and 44 will not be sensed in the programming scenario shown in FIG. 3 because the voltage drops across the memory cells 32, 36, 40, and 44 are close to zero (depending on the accuracy with which the voltages can be applied to the word lines W0, W1, W2 and the bit lines B0, B1, B2), which is insufficient to forward bias the rectifying junctions in these memory cells. The memory cells 30, 34, 42, and 46 also will not be sensed because the rectifying junctions in these memory cells will be reverse biased and therefore will not produce currents that are sufficient to interfere with the reading of the memory cell 38. Thus, the presence of the rectifying junctions in the memory cells 30, 34, 42, and 46 prevents these memory cells from inadvertently being read. The read voltage and the reference voltage used in the current sensor typically are selected to distinguish the forward bias current through the selected memory cell from the cumulative reverse bias currents of the rectifying junctions of the non-selected memory cells.

Figure 4:
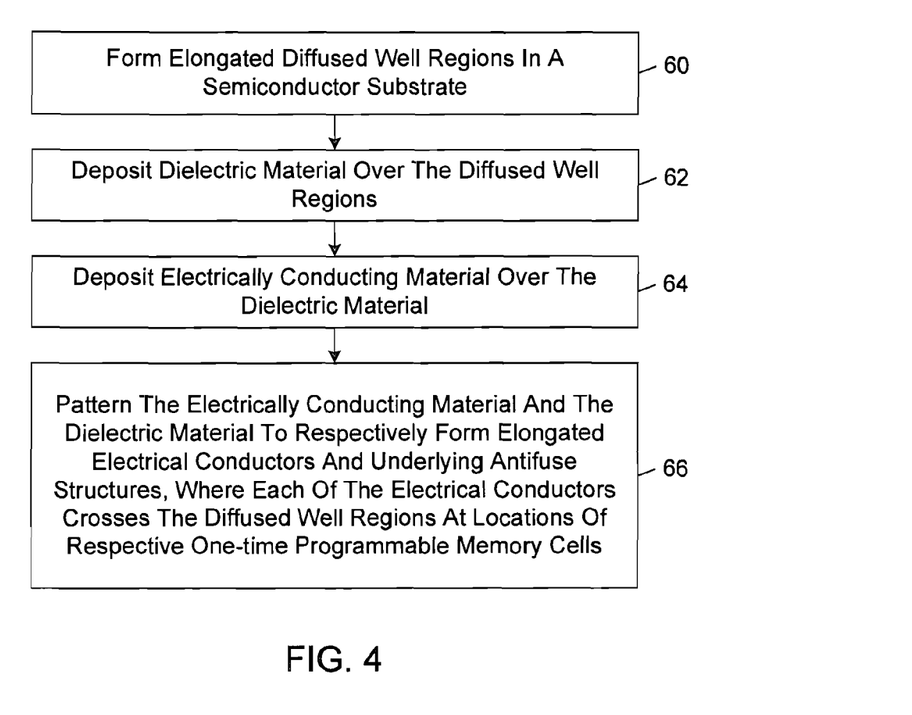
FIG. 4 is a flow diagram of an embodiment of a method of fabricating the memory cell array in the one-time programmable non-volatile memory circuit of FIG. 1.

FIG. 4 shows an embodiment of a method of fabricating the memory cell array 12 in the one-time programmable non-volatile memory circuit 10 shown in FIG. 1.

In accordance with this method, elongated diffused well regions are formed in a semiconductor substrate (FIG. 4, block 60). The semiconductor substrate has a first electrical conductivity type (i.e., n-type or p-type) and the diffused well regions have of a second electrical conductivity type that is opposite the first electrical conductivity type. Thus, if the substrate has an n-type electrical conductivity, the diffused well regions will have a p-type electrical conductivity.

Conversely, if the substrate has a p-type electrical conductivity, the diffused well regions will have an n-type electrical conductivity. The semiconductor substrate typically is a silicon substrate that is doped with a dopant species of a first electrical conductivity type, and the diffused well regions typically are formed by implanting elongated regions of the substrate with a dopant species of a second electrical conductivity type that is opposite the first electrical conductivity type.

Dielectric material is formed over the diffused well regions (FIG. 4, block 62). The dielectric material may be formed by growth or deposition. The dielectric material may include one or more dielectric layers, which may have the same or different compositions. In some embodiments, the dielectric material is a gate oxide layer that is formed in accordance with a standard CMOS (complementary metal-oxide-semiconductor) device fabrication process. In some embodiments, the gate oxide layer is thermally grown S102' which may or may not be nitrided. In other embodiments, the gate oxide may be formed of a high-k dielectric material (e.g., e hafnium and zirconium silicates and oxides), which has a dielectric constant (k) greater than the dielectric constant of $SiO_2$. In other embodiments, the dielectric material includes one or more layers of a nitride-based dielectric (e.g., silicon nitride). The composition and thickness of the dielectric material typically are selected in accordance with the requirements of the fabrication process (e.g., a standard CMOS fabrication process) that is being used to construct the one-time programmable non-volatile memory circuit 10.

Electrically conducting material is deposited over the dielectric material (FIG. 4, block 64). In general, the electrically conducting material may be deposited as one or more electrically conducting layers, which may have the same or different compositions. In some embodiments, the electrically conducting material includes one or more layers of doped polycrystalline silicon that has an electrical conductivity type that is opposite the electrical conductivity type of the substrate. In other embodiments, the electrically conducting material includes one or more metal layers (e.g., tungsten layers, copper layers, or gold layers).

The electrically conducting material and the dielectric material are patterned to respectively form elongated electrical conductors and underlying, self-aligned antifuse structures (FIG. 4, block 66). The electrically conducting material and the dielectric material are patterned so that each of the electrical conductors crosses the diffused well regions at respective crossing junctions that define the one-time programmable memory cells described above. In general, the electrically conducting material and the underlying dielectric material may be patterned by one or more lift-off or etching processes into the elongated electrical conductors and the underlying antifuse structures.

FIGS. 5A-7B show different memory cell embodiments in both unprogrammed and programmed states.

Figure 5A:
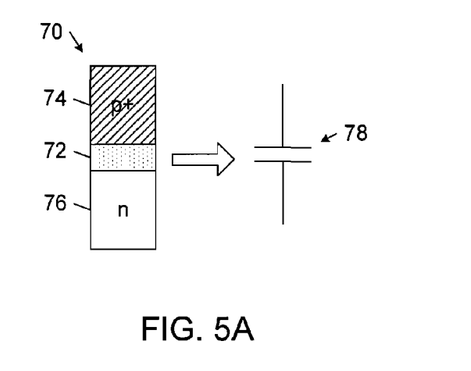
FIGS. 5A and 5B are diagrammatic sectional views of an embodiment of a memory cell in an unprogrammed state and a programmed state, respectively.

FIG. 5A shows an embodiment of a memory cell 70 in an unprogrammed state. In this state, the memory cell 70 includes a dielectric antifuse structure 72 between a p+ type electrical conductor 74 and an n-type diffused well region 76.

Figure 5B:
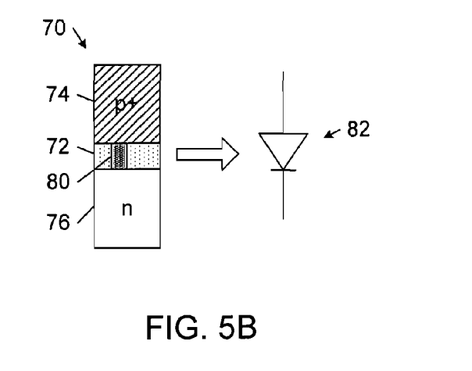

In this embodiment, the dielectric antifuse structure 72 is implemented by a CMOS gate oxide layer, the electrical conductor 74 is implemented by a p+polycrystalline silicon layer, and the diffused well region 76 is implemented by a n-type diffused well region in a p-type silicon substrate. This structure operates as a capacitor, as indicated by the capacitor circuit symbol 78. FIG. 5B shows the memory cell 70 in a programmed state. In this state, the memory cell includes an electrical short 80 across the dielectric antifuse structure 72. This structure operates as a diode, as indicated by the diode circuit symbol 82.

Figure 6A:
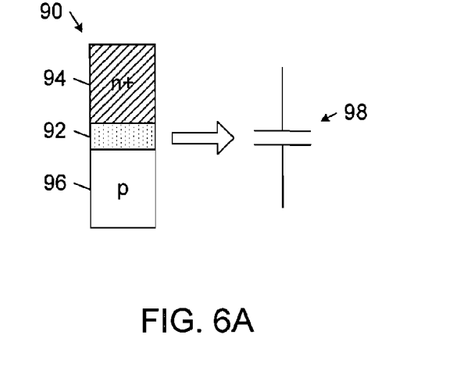
FIGS. 6A and 6B are diagrammatic sectional views of an embodiment of a memory cell in an unprogrammed state and a programmed state, respectively.

FIG. 6A shows an embodiment of a memory cell 90 in an unprogrammed state. In this state, the memory cell 90 includes a dielectric antifuse structure 92 between an n+ type electrical conductor 94 and a p-type diffused well region 96.

Figure 6B:
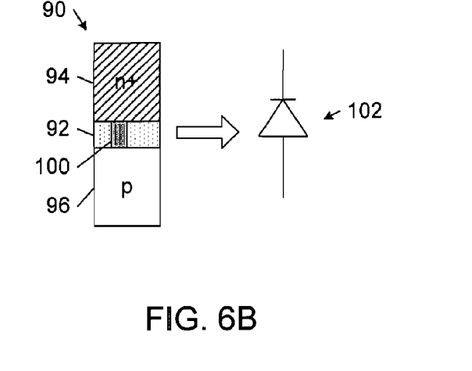

In this embodiment, the dielectric antifuse structure 92 is implemented by a CMOS gate oxide layer, the electrical conductor 94 is implemented by an n+ polycrystalline silicon layer, and the diffused well region 96 is implemented by a p-type diffused well region in an n-type silicon substrate. This structure operates as a capacitor, as indicated by the capacitor circuit symbol 98. FIG. 6B shows the memory cell 90 in a programmed state. In this state, the memory cell includes an electrical short 100 across the dielectric antifuse structure 92. This structure operates as a diode, as indicated by the diode circuit symbol 102.

Figure 7A:
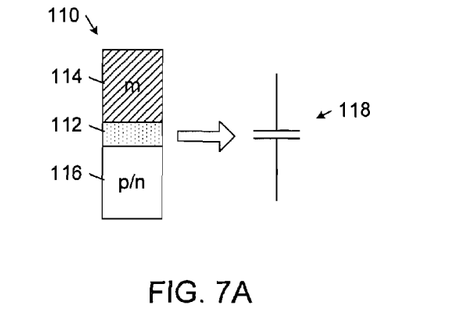
FIGS. 7A and 7B are diagrammatic sectional views of an embodiment of a memory cell in an unprogrammed state and a programmed state, respectively.
Figure 7B:
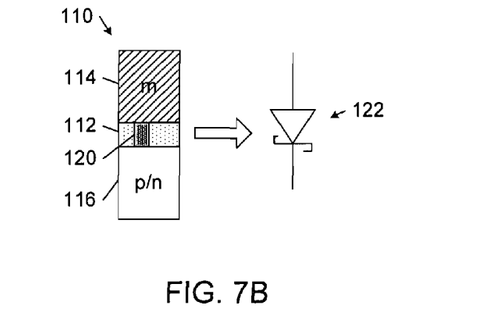

FIG. 7A shows an embodiment of a memory cell 90 in an unprogrammed state. In this state, the memory cell 110 includes a dielectric antifuse structure 112 between a metal electrical conductor 114 and a p-type or n-type diffused well region 116. In this embodiment, the dielectric antifuse structure 112 is implemented by a CMOS gate oxide layer, the electrical conductor 114 is implemented by metal layer, and the diffused well region 116 is implemented by a p-type or n-type diffused well region in a silicon substrate that is doped with a dopant species having the opposite electrical conductivity type of the diffused well region. This structure operates as a capacitor, as indicated by the capacitor circuit symbol 118. FIG. 7B shows the memory cell 110 in a programmed state.

In this state, the memory cell includes an electrical short 120 across the dielectric antifuse structure 112. This structure operates as a Schottky diode, as indicated by the Schottky diode circuit symbol 122.

III. A Second Embodiment of a One-Time Programmable Memory Circuit

Figure 8:
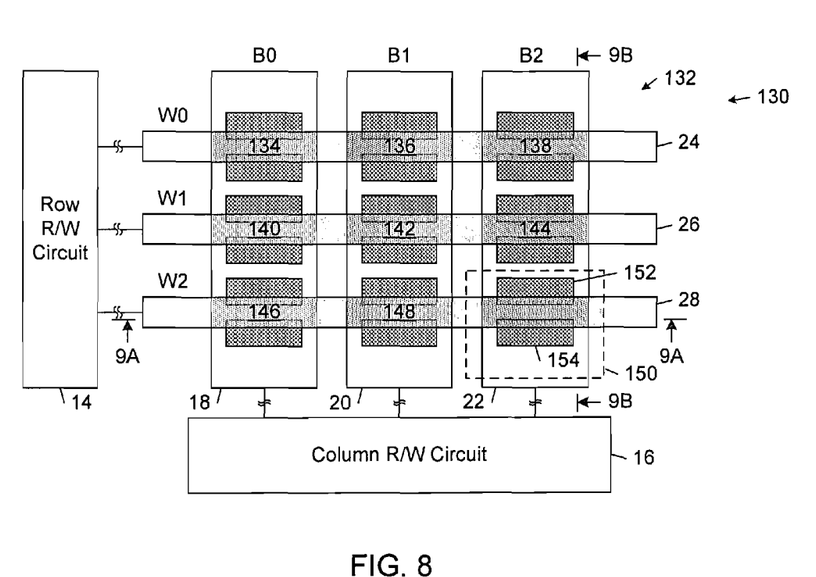
FIG. 8 is a diagrammatic view of an embodiment of a one-time programmable non-volatile memory circuit that includes a memory cell array, a row read/write circuit, and a column read/write circuit.
Figure 9A:
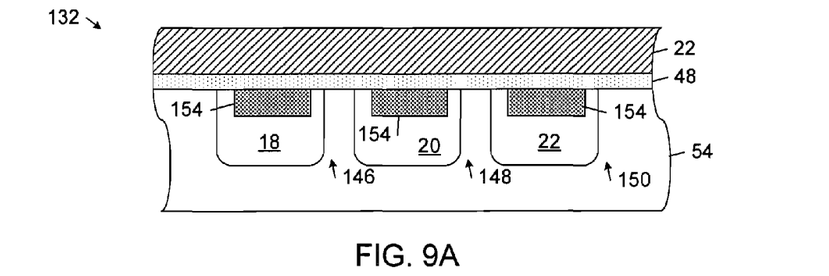
FIG. 9A is a diagrammatic sectional view of the memory cell array shown in FIG. 8 taken along the line 9A-9A.
Figure 9B:
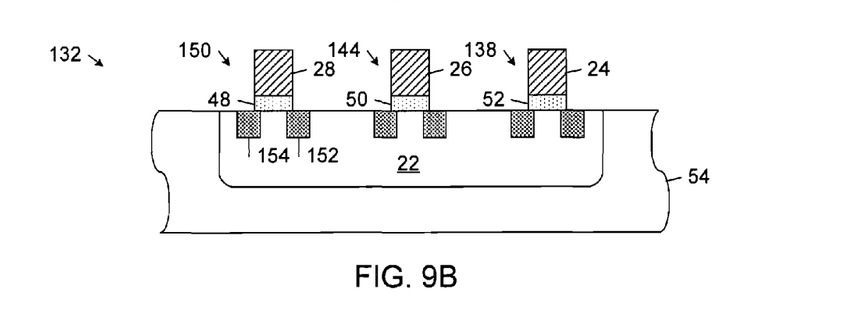
FIG. 9B is a diagrammatic sectional view of the memory cell array shown in FIG. 8 taken along the line 9B-9B.

FIGS. 8, 9A, and 9B show an embodiment of a one-time programmable non-volatile memory circuit 130 that includes a memory cell array 132, the row read/write circuit 14, and the column read/write circuit 16. The memory circuit 130 corresponds to the memory circuit 10 (see FIG. 1), except that each of the memory cells 134-150 (represented by memory cell 150 in FIG. 8) of the memory cell array 132 includes a respective pair of diffusion regions 152, 154 that are self-aligned with respect to opposite sides of the respective one of the electrical conductors 24-28. The diffusion regions 152, 154 have an electrical conductivity type that is opposite the electrical conductivity type of the diffused well regions.

The diffusion regions 152, 154 are formed in the respective diffused well regions by implanting regions of the diffused well regions with a high concentration of a dopant species to produce either n+ diffusion regions 152, 154 in p-type diffused well regions or p+ diffusion regions 152, 154 in n-type diffused well regions. In some embodiments, the diffusion regions 152, 154 are formed in accordance with a conventional CMOS fabrication process. In some of these embodiments, the electrical conductors 24-28 are polycrystalline silicon and the diffusion regions 152, 154 are formed during the implantation of a dopant species in the polycrystalline silicon conductors 24-28 in a self-aligned ion implantation process.

In other ones of these embodiments, the electrical conductors 24-28 are metal and the diffusion regions 152, 154 are formed in a conventional self-aligned ion implantation process that is used to form CMOS transistors in other parts of the memory circuit 130.

As shown in FIGS. 8-9B, in each of the memory cells 134-150, the respective pair of diffusion regions 152, 154 is coupled in parallel between the respective antifuse structure and the respective diffused well region. In each memory cell 134-150, the respective diffusion regions 152, 154 are unconnected to any electrical biasing lines other than the respective diffused well region and the respective electrical conductor.

Figure 10A:
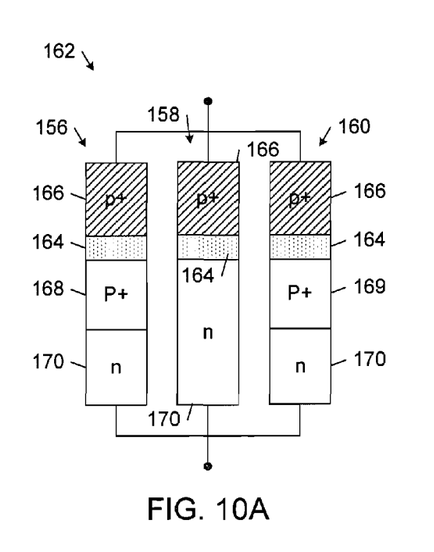
FIGS. 10A and 10B are diagrammatic sectional views of current flow paths through an embodiment of a memory cell in an unprogrammed state and a programmed state, respectively.

FIG. 10A diagrammatically shows three exemplary current flow paths 156, 158, 160 through an embodiment 162 of one of the memory cells of the memory circuit 130 in an unprogrammed state. The first current flow path 156 includes a dielectric antifuse structure 164 between a p+ type electrical conductor 166 and a first p+ diffusion region 168, which is formed in an n-type diffused well region 170. The second current flow path 158 includes the dielectric antifuse structure 164 between the p+ type electrical conductor 166 the n-type diffused well region 170. The third current flow path 160 includes the dielectric antifuse structure 164 between the p+ type electrical conductor 166 and a second p+ diffusion region 169, which also is formed in the same n-type diffused well region 170 as the first p+ diffusion region 168. In this embodiment, the dielectric antifuse structure 164 is implemented by a CMOS gate oxide layer, the electrical conductor 166 is implemented by a p+ polycrystalline silicon layer, and the diffused well region 170 is implemented by an n-type diffused well region in a p-type silicon substrate. In the unprogrammed state, the memory cell 162 structure operates as a capacitor.

Figure 10B:
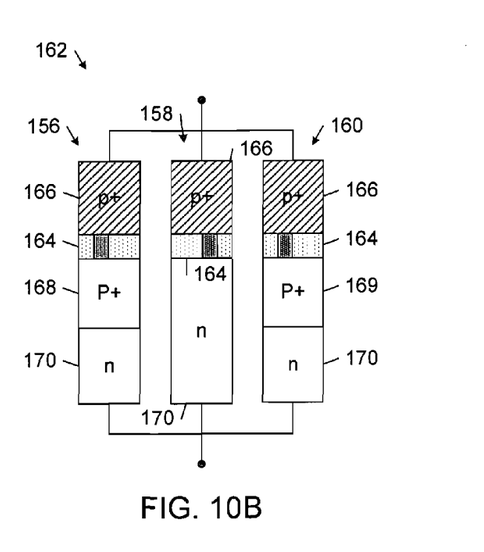

FIG. 10B shows the memory cell 162 in a programmed state. In this state, the memory cell includes one or more electrical shorts across the dielectric antifuse structure 164, as shown diagrammatically by the shaded rectangles in FIG. 10B. In the programmed state, the memory cell 162 operates as a diode.

IV. A Third Embodiment of a One-Time Programmable Memory Circuit

Figure 11:
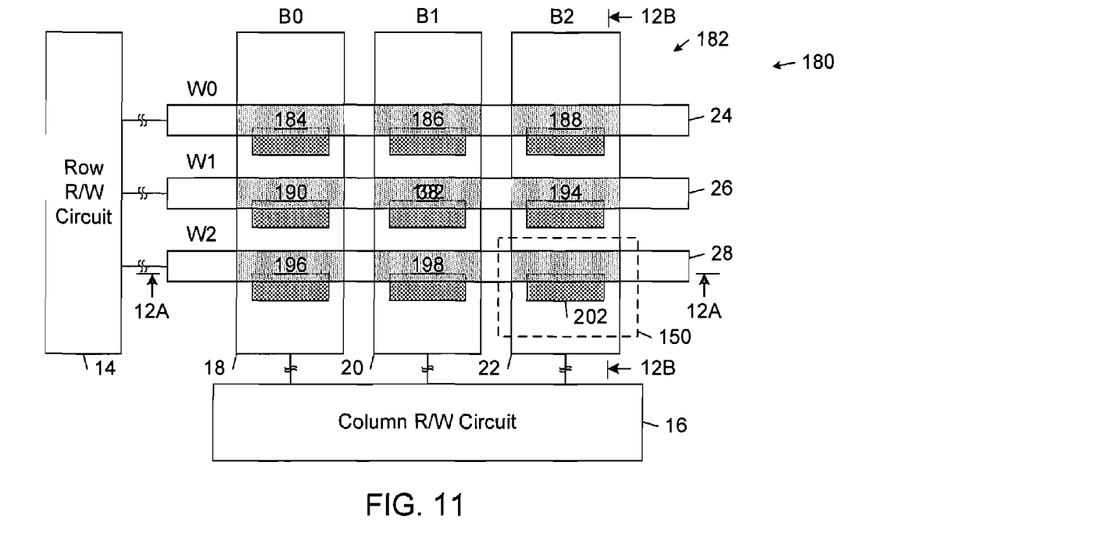
FIG. 11 is a diagrammatic view of an embodiment of a one-time programmable non-volatile memory circuit that includes a memory cell array, a row read/write circuit, and a column read/write circuit.
Figure 12A:
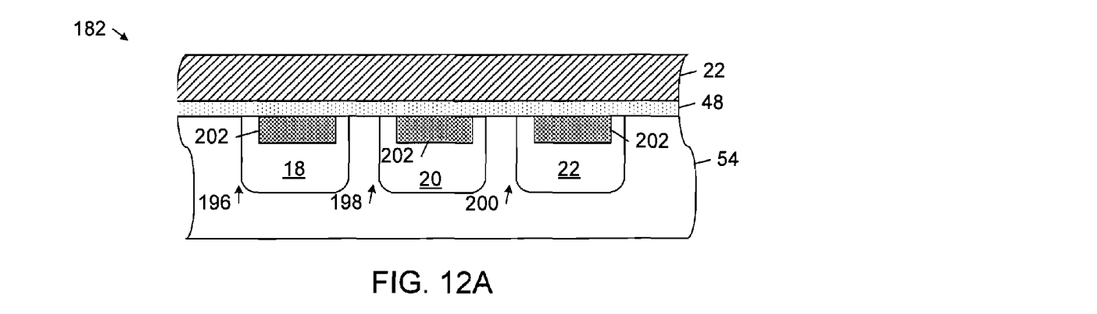
FIG. 12A is a diagrammatic sectional view of the memory cell array shown in FIG. 11 taken along the line 12A-12A.
Figure 12B:
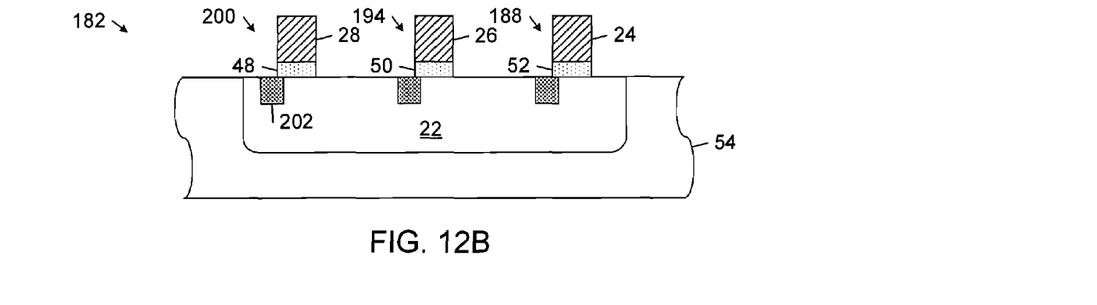
FIG. 12B is a diagrammatic sectional view of the memory cell array shown in FIG. 11 taken along the line 12B-12B.

FIGS. 11, 12A, and 12B show an embodiment of a one-time programmable non-volatile memory circuit 180 that includes a memory cell array 182, the row read/write circuit 14, and the column read/write circuit 16. The memory circuit 180 corresponds to the memory circuit 130 (see FIG. 8), except that each of the memory cells 184-200 (represented by memory cell 150 in FIG. 11) of the memory cell array 182 includes only one diffusion region 202 instead of two. The diffusion regions 202 are self-aligned with respect to one side of the respective electrical conductors 24-28. The diffusion regions 202 have an electrical conductivity type that is opposite the electrical conductivity type of the diffused well regions. The diffusion regions 202 are formed in the respective diffused well regions by implanting regions of the diffused well regions with a high concentration of a dopant species to produce either n+ diffusion regions 202 in p-type diffused well regions or p+ diffusion regions 202 in n-type diffused well regions. In some embodiments, the diffusion regions 202 are formed in accordance with a conventional CMOS fabrication process. In some of these embodiments, the electrical conductors 24-28 are polycrystalline silicon and the diffusion regions 202 are formed during the implantation of a dopant species in the polycrystalline silicon conductors 24-28 in a self-aligned ion implantation process. In other ones of these embodiments, the electrical conductors 24-28 are metal and the diffusion regions 202 are formed in a conventional self-aligned ion implantation process that is used to form CMOS transistors in other parts of the memory circuit 180.

As shown in FIGS. 11-12B, in each of the memory cells 184-200, the respective diffusion region 202 is between the respective antifuse structure and the respective diffused well region. In each memory cell 184-200, the respective diffusion region 202 is unconnected to any electrical biasing lines other than the respective diffused well region and the respective electrical conductor.

In some embodiments, the dielectric antifuse structures 48-52 are implemented by a patterned CMOS gate oxide layer, the electrical conductors 24-28 are implemented by a p+ polycrystalline silicon layer, the diffused well regions 18-22 are implemented by n-type diffused well regions in a p-type silicon substrate, and the diffusion regions are implemented by p+ ion implant regions in the respective n-type well regions. In these embodiments, the current flow paths through each of the memory cells can be modeled by the first and second parallel current flow paths 156, 158 shown in FIGS. 12A and 12B.

V. A Fourth Embodiment of a One-Time Programmable Memory Circuit

Figure 13:
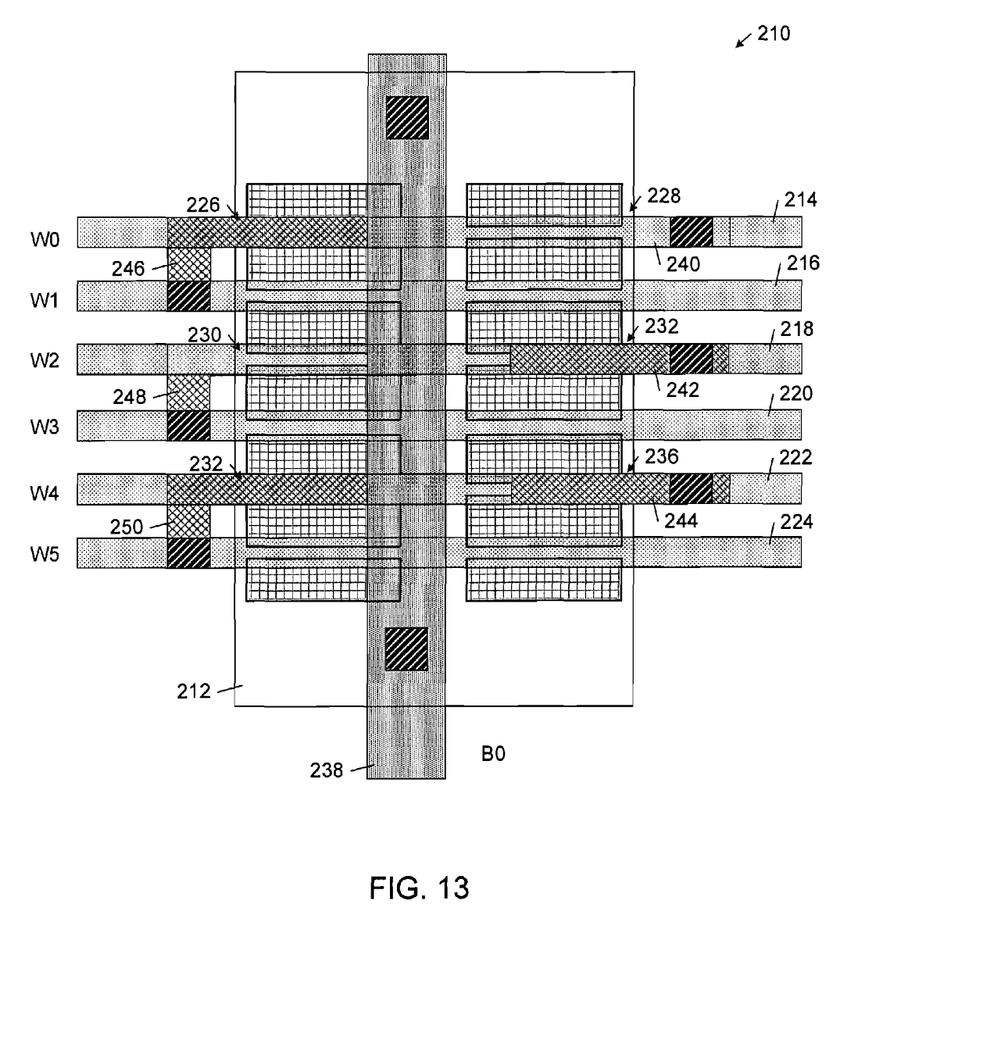
FIG. 13 is a diagrammatic view of an embodiment of a block memory cells in an embodiment of a one-time programmable non-volatile memory circuit.

FIG. 13 shows a block of memory cells in an embodiment of a one-time programmable non-volatile memory cell array 210. The block of the memory cell array 210 shown in FIG. 13 includes a diffused well region 212 and a set of elongated electrical conductors 214, 216, 218, 220, 222, 224. Each of the electrical conductors 214, 218, 222 crosses the diffused well region 212 at locations of two memory cells 226 and 228, 230 and 232, 234 and 236, respectively. Embodiments of the memory cells 226-236 correspond to respective ones of the memory cell embodiments described above. Thus, each of the memory cells 226-236 includes a respective antifuse structure between the respective electrical conductor 214, 218, 222 and the diffused well region 212. Each memory cell 226-236 is a respective one-time programmable memory cell that has a first state and a second state. In the first state, the memory cell has a first electrical resistance. In the second state, the memory cell has a second electrical resistance lower than the first electrical resistance. The memory cells 236-246 are formed in a semiconductor substrate, which has an electrical conductivity type that is opposite the electrical conductivity type of the diffused well region 212.

In some embodiments, the diffused well region 212 forms a respective bit line (labeled B0) that is connected electrically to the column read/write circuit 16 by an electrical conductor 238, which typically is implemented by a metal line or a doped polycrystalline silicon line. The electrical conductors 214-224 form respective word lines (respectively labeled W0, W1, W2, W3, W4, W5), which electrically connect respective ones of the memory cells 226-236 to the row read/write circuit 14. In the illustrated embodiment, the electrical conductors 214, 218, 222 are electrically connected to underlying electrically conducting lines 240, 242, 244, which are in contact with the respective antifuse structures of the memory cells 228, 232, 236. The electrical conductors 216, 220, 224 are electrically connected to electrically conducting lines 246, 248, 250, which are in contact with the respective antifuse structures of the memory cells 226, 230, 234. The row read/write circuit 14 and the column read/write circuit 16 cooperatively apply write and read signals across selected ones of the memory cells 226-236 in order to irreversibly program respective ones of the memory cells and to sense the states of the memory cells.

The arrangement of the memory cells 226-236 in the memory cell array 210 allows the areal density of the memory cells to be increased while conforming to conventional CMOS fabrication design rules. The memory cell array 210 may be formed from an array of the memory cell blocks shown in 13. The elongated diffusion regions 212 of the blocks in the same column of the array may be strapped together at regular intervals by metal bit line implementations of the electrical conductor 238. The metal bit lines reduce the series resistance of the bit lines as compared to embodiments in which the bit lines are implemented by respective elongated diffused well regions.

VI. Examplary Embodiments of Read/Write Driver Circuits

As explained above, in some embodiments, the row read/write circuit 14 includes a respective drive circuit for each of the electrical conductors 24-28 and the column read/write circuit 16 includes a respective state sense circuit for each of the diffused well regions 18-22. In other embodiments, the column read/write circuit 16 includes a respective drive circuit for each of the electrical conductors 24-28 and the row read/write circuit 14 includes a respective state sense circuit for each of the diffused well regions 18-22.

The row read/write circuit 14 and the column read/write circuit 16 also respectively include word line and bit line select transistors that selectively connect the electrical conductor and the diffused well regions to the read and write voltage levels. These select transistors typically are implemented by circuits that enable a high voltage to be applied across the selected memory cells. In some embodiments, these select transistors are implemented by CMOS transistors that include thick or I/O oxide in a conventional CMOS technology. In other embodiments, these select transistors are implemented using circuits that limit the voltages that appear across any of their transistors during the programming cycle. In some embodiments, a combination of circuit techniques and thick oxide layers are used to achieve high voltages across the memory cells, resulting in fast write speeds and low turn-on resistance after programming.

Figure 14:
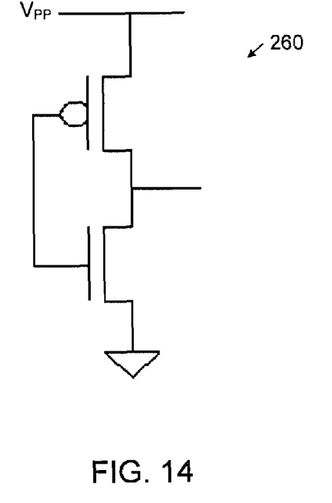
FIG. 14 is a circuit diagram of an embodiment of a driver circuit.
Figure 15:
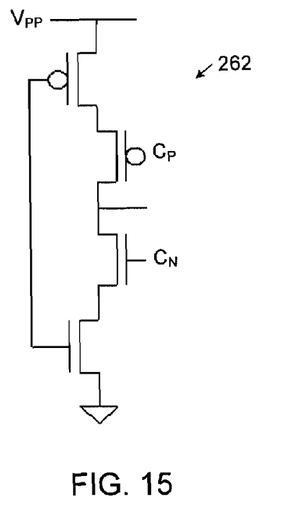
FIG. 15 is a circuit diagram of an embodiment of a driver circuit.
Figure 16:
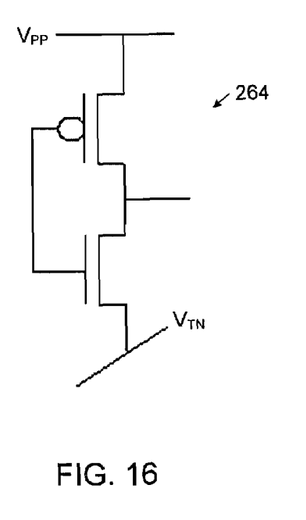
FIG. 16 is a circuit diagram of an embodiment of a driver circuit.
Figure 17:
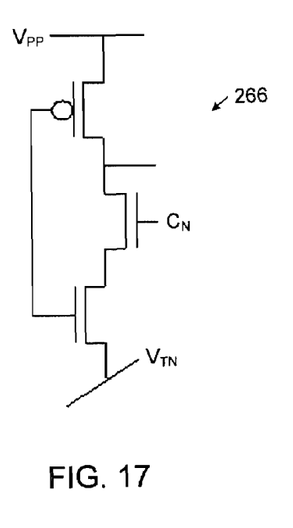
FIG. 17 is a circuit diagram of an embodiment of a driver circuit.

FIGS. 14-17 show exemplary line driver circuits 260-266 that may be incorporated as the last stage in one or both of the row read/write circuit 14 and the column read/write circuit 16. FIG. 14 shows a CMOS inverter driver circuit 260, which limits the $V_{PP}$ voltage to the maximum voltage that can be applied across any one transistor of the inverter. FIG. 15 shows a CMOS cascode driver circuit 262 that is biased with intermediate voltages $C_P$ and $C_N$, which typically are set to voltages equal to approximately $0.5 \times V_{PP}$. FIG. 16 shows a CMOS driver circuit 264 that applies approximately an N-threshold in series with an NMOS pulldown transistor, increasing the voltage that can be applied to $V_{PP}$ by approximately $V_{TN}$. FIG. 17 shows a CMOS driver circuit 266 that combines the elements of the driver circuit 262 (FIG. 15) and the driver circuit 264 (FIG. 16) in order to protect the NMOS transistor while achieving a higher $V_{PP}$.

VIII. Conclusion

The embodiments that are described herein enable the production of one-time programmable non-volatile memory circuits that are characterized by high memory cell densities and fast read/write speeds. In addition, these embodiments can be implemented using conventional CMOS technology. This feature allows these implementations to be integrated readily into existing CMOS process flows, reducing fabrication costs and shortening lead times.

In the embodiments described above, the memory cells do not include any select transistor; instead, the diffused well regions are used as the bit lines for selecting the memory cells during programming and reading. Although conventional CMOS fabrication design rules typically specify relatively large minimum dimensions for diffused well regions, omitting select transistors in the memory cells achieves several significant advantages. First, the scaling of some of the embodiments of the memory cell that are described herein is limited only by the minimum design rules for polycrystalline silicon word lines and diffusion regions in one dimension, and the design rules for the diffused well regions in the other dimension, resulting in significant cell area reduction as the technology scales. Second, omitting select transistors in the memory cells allows most of the programming voltage to appear across the antifuse structure in embodiments of the memory cells described herein; in addition, the effective series resistance during programming is only limited by the word line and bit line select transistors. The sizes of these transistors can be increased to reduce the overall series resistance and achieve low turn-on resistance after programming without increasing the memory cell area. This feature results in both fast programming times and fast read times. Third, the design rules are intended for all possible transistors/diffusions in a complete integrated circuit chip. The structures of the memory cells described herein are readily characterized and could potentially scale to dimensions that are significantly smaller than that required by conventional CMOS design rules. Fourth, the memory cell embodiments described herein can be driven with large drive currents and therefore can be read at the low voltage levels.

Other embodiments are within the scope of the claims.

What is claimed is:

1. An apparatus, comprising:
a semiconductor substrate of a first electrical conductivity type;
elongated diffused well regions in the semiconductor substrate, wherein the diffused well regions are of a second electrical conductivity type opposite the first electrical conductivity type; and
elongated electrical conductors each of which crosses the diffused well regions at respective locations of one-time programmable memory cells, wherein each of the memory cells comprises a respective antifuse structure between the respective diffused well region and the respective electrical conductor, each of the memory cells has a first state in which the antifuse structure has a first electrical resistance and a second state in which the antifuse structure has a second electrical resistance lower than the first electrical resistance, and in the second state each of the memory cells comprises a respective rectifying junction between the respective diffused well region and the respective electrical conductor.

2. The apparatus of claim 1, wherein the diffused well regions are arranged in parallel columns and the electrical conductors are arranged in parallel rows that are orthogonal to the diffused well regions.

3. The apparatus of claim 1, wherein each of the memory cells comprises a respective first diffusion region of the first electrical conductivity type at a respective location in the respective elongated diffused well region that is self-aligned with respect to a first side of the respective electrical conductor.

4. The apparatus of claim 3, wherein each of the memory cells comprises a respective second diffusion region of the first electrical conductivity type at a respective location in the respective diffused well region that is self-aligned with respect to a second side of the respective electrical conductor opposite the first side.

5. The apparatus of claim 4, wherein in each of the memory cells the respective antifuse structure separates the respective electrical conductor from the respective first and second diffusion regions.

6. The apparatus of claim 4, wherein in each of the memory cells the respective first and second diffusion regions are unconnected to any electrical biasing lines other than the respective diffused well region and the respective electrical conductor.

7. The apparatus of claim 1, wherein each of the memory cells is free of any electrical biasing lines other than the respective diffused well region and the respective electrical conductor.

8. The apparatus of claim 1, wherein each of the memory cells is free of any transistors.

9. The apparatus of claim 1, wherein each of the electrical conductors comprises a respective metal layer.

10. The apparatus of claim 1, wherein each of the electrical conductors comprises a respective polycrystalline silicon layer of the first electrical conductivity type.

11. The apparatus of claim 1, wherein each of the antifuse structures comprises a dielectric layer.

12. The apparatus of claim 1, further comprising a state sense circuit operable to sense the respective state of each of the memory cells based on current flow along an electrical path comprising the respective electrical conductor, the respective antifuse structure, and the respective diffused well region.

13. The apparatus of claim 1, wherein each of the electrical conductors crosses each of the diffused well regions at respective locations of two or more of the memory cells.

* * * * *